(12) United States Patent
Tanaka et al.

(10) Patent No.: US 7,032,739 B2
(45) Date of Patent: Apr. 25, 2006

(54) INTERMEDIATE PRODUCT CARRYING APPARATUS, AND INTERMEDIATE PRODUCT CARRYING METHOD

(75) Inventors: Shuji Tanaka, Chino (JP); Yoshitake Kobayashi, Shiojiri (JP); Hisashi Fujimura, Chino (JP); Yasutsugu Aoki, Kofu (JP)

(73) Assignee: Seiko Epson Corporation, (JP)

( * ) Notice: Subject to any disclaimer, the term of this patent is extended or adjusted under 35 U.S.C. 154(b) by 28 days.

(21) Appl. No.: 10/813,569

(22) Filed: Mar. 30, 2004

(65) Prior Publication Data

US 2004/0253080 A1    Dec. 16, 2004

(30) Foreign Application Priority Data

Mar. 31, 2003    (JP)    ............................. 2003-094436

(51) Int. Cl.
*B65G 29/00* (2006.01)

(52) U.S. Cl. .............................. 198/465.1; 198/465.2; 414/935; 414/937

(58) Field of Classification Search ................ 414/935, 414/937, 941, 570; 198/465.1–465.3; 29/25.01
See application file for complete search history.

(56) References Cited

U.S. PATENT DOCUMENTS

| | | | | |
|---|---|---|---|---|
| 4,178,113 A | * | 12/1979 | Beaver et al. ................. | 406/10 |
| 5,382,127 A | * | 1/1995 | Garric et al. ............. | 414/217.1 |
| 5,417,537 A | * | 5/1995 | Miller ......................... | 414/217 |
| 5,443,346 A | * | 8/1995 | Murata et al. ......... | 414/222.13 |
| 5,536,128 A | * | 7/1996 | Shimoyashiro et al. ..... | 414/273 |
| 5,658,115 A | * | 8/1997 | Yamazaki et al. ........ | 414/751.1 |
| 5,855,465 A | * | 1/1999 | Boitnott et al. ......... | 414/331.18 |
| 5,976,199 A | * | 11/1999 | Wu et al. ................... | 29/25.01 |
| 6,149,367 A | * | 11/2000 | Begin ..................... | 414/331.18 |
| 6,282,459 B1 | * | 8/2001 | Ballantine et al. .......... | 700/245 |
| 6,413,356 B1 | * | 7/2002 | Chokshi et al. ......... | 156/345.32 |
| 6,449,522 B1 | * | 9/2002 | Conboy et al. ............. | 700/121 |
| 6,473,996 B1 | * | 11/2002 | Tokunaga ..................... | 34/417 |
| 6,519,502 B1 | * | 2/2003 | Chao .......................... | 700/213 |
| 6,562,094 B1 | * | 5/2003 | Denker et al. ............. | 55/385.2 |
| 6,568,896 B1 | * | 5/2003 | Franklin et al. ............ | 414/217 |
| 6,599,763 B1 | * | 7/2003 | Reyes et al. ................... | 438/14 |
| 6,663,340 B1 | * | 12/2003 | Zeakes et al. .............. | 414/788 |
| 6,722,840 B1 | * | 4/2004 | Fujisawa et al. ....... | 414/416.01 |
| 6,746,198 B1 | * | 6/2004 | White et al. ........... | 414/222.13 |
| 6,758,647 B1 | * | 7/2004 | Kaji et al. .................. | 414/217 |

FOREIGN PATENT DOCUMENTS

| | | |
|---|---|---|
| JP | 02-078243 | 3/1990 |
| JP | 02-117512 | 5/1990 |
| JP | 06-310424 | 11/1994 |
| JP | 07-122622 | 5/1995 |
| JP | 11-145022 | 5/1999 |
| JP | 2001-338968 | 12/2001 |
| JP | 2002-237512 | 8/2002 |
| JP | 2002-334917 | 11/2002 |

* cited by examiner

*Primary Examiner*—Gene O. Crawford
*Assistant Examiner*—Rashmi Sharma
(74) *Attorney, Agent, or Firm*—Harness, Dickey & Pierce, P.L.C.

(57) ABSTRACT

An intermediate product carrying apparatus is provided for loading a carrier, which is carried between a plurality of process systems and stores a plurality of intermediate products, into the corresponding process system, and then transferring the plurality of intermediate products of the carrier to a single wafer carrying conveyer, which carries the intermediate products in a single wafer state to an intermediate product manufacturing apparatus provided in the process system. The intermediate product carrying apparatus comprising: an intermediate product transfer means provided in the process system, for loading the carrier, which is carried between process systems and which stores the plurality of intermediate products, into the corresponding process system, and transferring the intermediate products.

8 Claims, 8 Drawing Sheets

FIRST EMBODIMENT

INTERMEDIATE PRODUCT CARRYING APPARATUS, AND INTERMEDIATE PRODUCT CARRYING METHOD

RELATED APPLICATIONS

This application claims priority to Japanese Patent Application No. 2003-094436 filed Mar. 31, 2003 which is hereby expressly incorporated by reference herein in its entirety.

BACKGROUND

1. Technical Field of the Invention

The present invention relates to an intermediate product carrying apparatus and an intermediate product carrying method, for taking in a carrier which is carried between a plurality of process systems and which stores a plurality of intermediate products, and changing the sequence or combination of intermediate products in the carrier.

2. Description of the Related Art

Semiconductor manufacturing apparatuses for manufacturing semiconductor wafers (hereinafter referred to as 'wafers') as intermediate products include a variety of wafer manufacturing apparatuses, such as lithography apparatuses, film forming apparatuses, etching apparatuses, cleaning apparatuses, inspection apparatuses, etc.

Between process systems from a group of a kind of semiconductor manufacturing apparatuses to a group of other kinds of semiconductor manufacturing apparatuses, the wafers are carried in a state where the wafers are stored in storage members called wafer carriers. The wafers are removed from a carrier and carried to an arbitrary process system, and then the wafers are subjected to a predetermined process in the process system.

Some of the semiconductor manufacturing apparatuses having such a plurality of processes are arranged in a line along a sequential carrying path (for example, see Japanese Unexamined Patent Application Publication No. 11-145022 (see page 1 and FIG. 1)).

On the other hand, because of the requirement for limited production of a wide variety of wafers, a so-called single wafer carrying method of carrying wafers on a conveyer, one by one, in place of carrying the wafers using carriers (also referred to as wafer cassettes) has been disclosed. This single wafer carrying method is intended to cope with the limited production of a variety of wafers (for example, see Japanese Unexamined Patent Application Publication No. 2002-334917 (see page 1 and FIG. 1)). It is desired that such a single wafer carrying method be used for intra-process wafer carrying.

When it is intended to transfer wafers in a carrier directly from the carrier carried in inter-process carrying, as described above, to the single wafer carrying conveyer, the following problems are caused.

In the carrier carried in inter-process carrying from a previous process system, a plurality of wafers to be processed by different manufacturing apparatuses in the desired process system are mixed and stored.

The wafers may not be directly transferred into the single wafer carrying conveyer, depending upon situations of the manufacturing apparatuses in the process system.

When wafers in the carrier carried in inter-process carrying are transferred into the single wafer carrying conveyer in the order of arrival, a great deal of setup time may be required, thereby reducing production efficiency of the apparatuses.

Therefore, the present invention is contrived to solve the above problems, and it is thus an object of the present invention to provide an intermediate product carrying apparatus and an intermediate product carrying method, in which intermediate products stored in a carrier carried between process systems can actively be transferred in accordance with the order or combination obtained by considering efficiencies when intermediate products are taken into the desired process system, and can then be carried to the desired manufacturing apparatus.

SUMMARY

According to an aspect of the present invention, there is provided an intermediate product carrying apparatus for taking a carrier, which is carried between a plurality of process systems and which stores a plurality of intermediate products, into the desired process system, and then transferring the plurality of intermediate products in the carrier to a single wafer carrying conveyer, which carries the intermediate products in a single wafer state to an intermediate product manufacturing apparatus provided in the process system, the intermediate product carrying apparatus comprising: an intermediate product transfer means provided in the process system, for taking the carrier, which is carried between process systems and which stores the plurality of intermediate products, into the desired process system, and transferring the intermediate products between the carrier and another carrier.

According to such a construction, a single wafer carrying conveyer is provided in a process system. The single wafer carrying conveyer carries intermediate products in a single wafer state to intermediate product manufacturing apparatuses provided in the process system.

An intermediate product transfer means is provided in the process system. The intermediate product transfer means takes the carrier, which is carried between process systems and which stores the plurality of intermediate products, into the desired process system, and transfers the intermediate products. Then, the intermediate product transfer means transfers the transferred intermediate products into the single wafer carrying conveyer.

As a result, the intermediate product transfer means can actively change the order or combination of intermediate products, and stores the order-changed intermediate products from the carrier carried between process systems into the carrier used in the process system, in accordance with the order or combination in which it is intended to transfer the intermediate products in the process system.

Accordingly, intermediate products having the same destination can be mounted on a carrier. Therefore, the wafers mounted on the carrier can be sequentially transferred to the single wafer carrying conveyer and efficiently carried to any manufacturing apparatus in the process system. As a result, it is possible to enhance the carrying efficiency of intermediate products, and to shorten the time for carrying, thereby enhancing manufacturing efficiency.

In the above construction, it is preferable that the single wafer carrying conveyer has a plurality of platforms in the carrying direction, and that each platform holds at least one intermediate product.

According to this construction, the single wafer carrying conveyer has a plurality of platforms in the carrying direction. Each platform can hold at least one intermediate product. As a result, it is possible to further enhance the carrying efficiency of intermediate products by the single wafer carrying conveyer.

In the above construction, it is preferable that the intermediate product transfer means comprises the following components: a carrier stocker for holding a plurality of carriers; a first transfer section taking the carriers carried between process systems into the carrier stocker and removing the carriers from the carrier stocker; intermediate product stocker storing the intermediate products; an intermediate product transfer and order-change means for transferring intermediate products stored in the carrier of the carrier stocker to the intermediate product stocker and storing again the intermediate products of the intermediate product stocker into the carrier of the carrier stocker, thereby changing the arrangement order of the intermediate products; and a second transfer section for transferring the order-changed intermediate products in the carrier between the carrier and the single wafer carrying conveyer.

According to this construction, the first transfer section takes the carrier carried between process systems into the carrier stocker. The first transfer section also has a function of externally removing the carrier from the carrier stocker.

The intermediate product transfer and order-change means transfers intermediate products stored in the carrier of the carrier stocker to the intermediate product stocker. The intermediate product transfer and order-change means changes the arrangement order of the intermediate products in the intermediate product stocker, and then transfers the order-changed intermediate products to the carrier.

The second transfer section transfers the order-changed intermediate products of the carrier between the carrier and the single wafer carrying conveyer.

Accordingly, the intermediate product transfer and order-change means can store the intermediate products, of which the arrangement order is changed, in the carrier. The second transfer section can efficiently transfer the order-changed intermediate products from the carrier to the single wafer carrying conveyer.

In the above construction, it is preferable that the second transfer section comprise at least one transfer robot, and that when the second transfer section comprises a plurality of transfer robots, a tray for the intermediate products be provided between the transfer robots.

According to this construction, the second transfer section comprises at least one transfer robot. When the second transfer section comprises a plurality of transfer robots, a tray for the intermediate products is provided between the transfer robots.

As a result, the second transfer section can further efficiently transfer the order-changed intermediate products between the carrier and the single wafer carrying conveyer.

In the above construction, it is preferable that the intermediate products are semiconductor wafers, and that a plurality of manufacturing apparatuses for processing the intermediate products be arranged in the single wafer carrying conveyer.

According to this construction, the intermediate products are semiconductor wafers. A plurality of manufacturing apparatuses for processing the intermediate products are arranged in the single wafer carrying conveyer.

Accordingly, wafers having the same destination can be sequentially and efficiently carried to respective manufacturing apparatuses.

According to another aspect of the present invention, there is provided an intermediate product carrying method of taking a carrier, which is carried between a plurality of process systems and which stores a plurality of intermediate products, into the desired process system, then transferring and carrying the intermediate products of the carrier to another carrier, the method comprising the following steps: a carrier take-in step of taking the carrier, which is carried between the plurality of process systems and which stores the plurality of intermediate products, into the desired process system; an intermediate product transfer step of transferring the intermediate products stored in the carrier, and transferring the transferred intermediate products to a single wafer carrying conveyer; and an intra-process single wafer carrying step of carrying the intermediate products in a single wafer state to an intermediate product manufacturing apparatus provided in the process system by means of the single wafer carrying conveyer.

According to this construction, in the carrier take-in step, the carrier which is carried between process systems and which stores the plurality of intermediate products is taken into the corresponding process system.

In the intermediate product transfer step, the intermediate products stored in the carrier are transferred. The transferred intermediate products are transferred to the single wafer carrying conveyer.

In the single wafer carrying step, the single wafer carrying conveyer can carry the intermediate products in a single wafer state to the intermediate product manufacturing apparatuses arranged in the process system.

As a result, the intermediate product transfer means can actively change the order or combination of intermediate products and stores the order-changed intermediate products from the carrier carried between process systems to the carrier used in the process system, in accordance with the order or combination in which it is intended to transfer the intermediate products into the process system.

Accordingly, intermediate products having the same destination can be mounted on the carrier. Therefore, the wafers mounted on the carrier can be sequentially transferred to the single wafer carrying conveyer, and efficiently carried to any manufacturing apparatus in the process system. As a result, it is possible to enhance the carrying efficiency of intermediate products and to shorten the time for carrying, thereby enhancing manufacturing efficiency.

In the above construction, it is preferable that the intermediate products be semiconductor wafers, that the single wafer carrying conveyer has a plurality of platforms in the carrying direction, and that each platform holds at least one intermediate product.

According to this construction, the intermediate products are semiconductor wafers. The plurality of manufacturing apparatuses for processing the intermediate products are arranged in the single wafer carrying conveyer.

Accordingly, wafers having the same destination can be sequentially and efficiently carried to respective manufacturing apparatuses.

DETAILED DESCRIPTION

Now, preferred embodiments of the present invention will be described with reference to the accompanying drawings.

Figure 1:
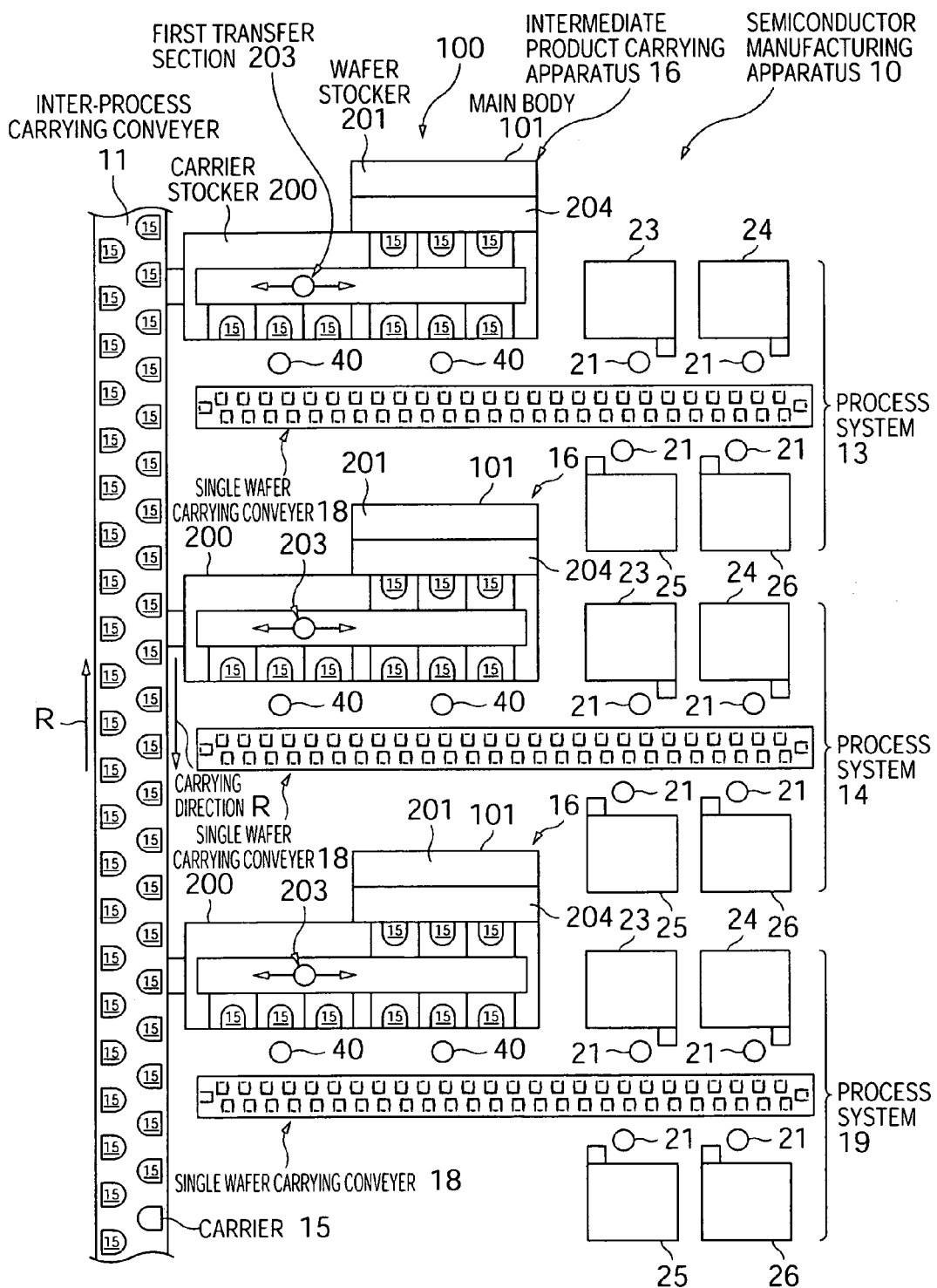
FIG. 1 is a plan view showing a part of a semiconductor manufacturing apparatus including an embodiment of an intermediate product carrying apparatus according to the present invention.

FIG. 1 shows an example of a semiconductor manufacturing apparatus including a preferred embodiment of an intermediate product carrying apparatus according to the present invention.

The intermediate products in the semiconductor manufacturing apparatus 10 shown in FIG. 1 are semiconductor wafers (hereinafter referred to as 'wafers W').

The semiconductor manufacturing apparatus 10 is also called a semiconductor manufacturing system, and is a manufacturing facility for manufacturing wafers through a plurality of process systems which perform a plurality of processes. By using the wafers W, for example, substrates for liquid crystal display devices can be manufactured.

The semiconductor manufacturing apparatus 10 shown in FIG. 1 comprises an inter-process carrying conveyer 11 and a plurality of process systems (hereinafter referred to as 'process systems') 13, 14, 19.

In the example of the semiconductor manufacturing apparatus 10 of FIG. 1, for the purpose of simplification of the drawing, for example, three process systems 13, 14, 19 are shown.

However, the number of process systems is not particularly limited, but may be two, or four or more. In FIG. 1, the process systems 13, 14, 19 are sequentially arranged on one side of the inter-process carrying conveyer 11 in the carrying direction R of the inter-process carrying conveyer 11. However, not limited to this arrangement, the process systems may be arranged at either side of the inter-process carrying conveyer 11, respectively.

The inter-process carrying conveyer 11 carries carriers 15 in the carrying direction R and supplies the carriers to any one of the process systems 13, 14, 19.

In the embodiments of the present invention, the term 'inter-process' represents, for example, the period of time between process systems 13 and 14, or the period of time between process systems 14 and 19, or the period of time between process systems 13 and 19 of the process systems 13, 14 and 19.

In addition, the term 'intra-process' represents respective interiors of the process systems 13, 14 and 19. A 'process system' is also called a 'bay'.

Intermediate product carrying apparatuses 16 are provided in process systems 13, 14, 19 shown in FIG. 1, respectively.

The semiconductor manufacturing apparatus 10 shown in FIG. 1 is as a whole provided preferably inside a clean room. Respective process systems 13, 14, 19 are also provided inside individual clean rooms. Each clean room generates an air flow (down-flow) from the ceiling to below the bottom thereof, whereby dust in the air is removed to maintain the inside of the clean rooms within a predetermined cleanliness level (cleanliness class).

Each process system 13, 14, 19 has a single wafer carrying conveyer 18. Each single wafer carrying conveyer 18 is sectioned by a clean tunnel. The clean tunnel partitions a space through which the wafers W pass into a very small closed space.

Figure 3:
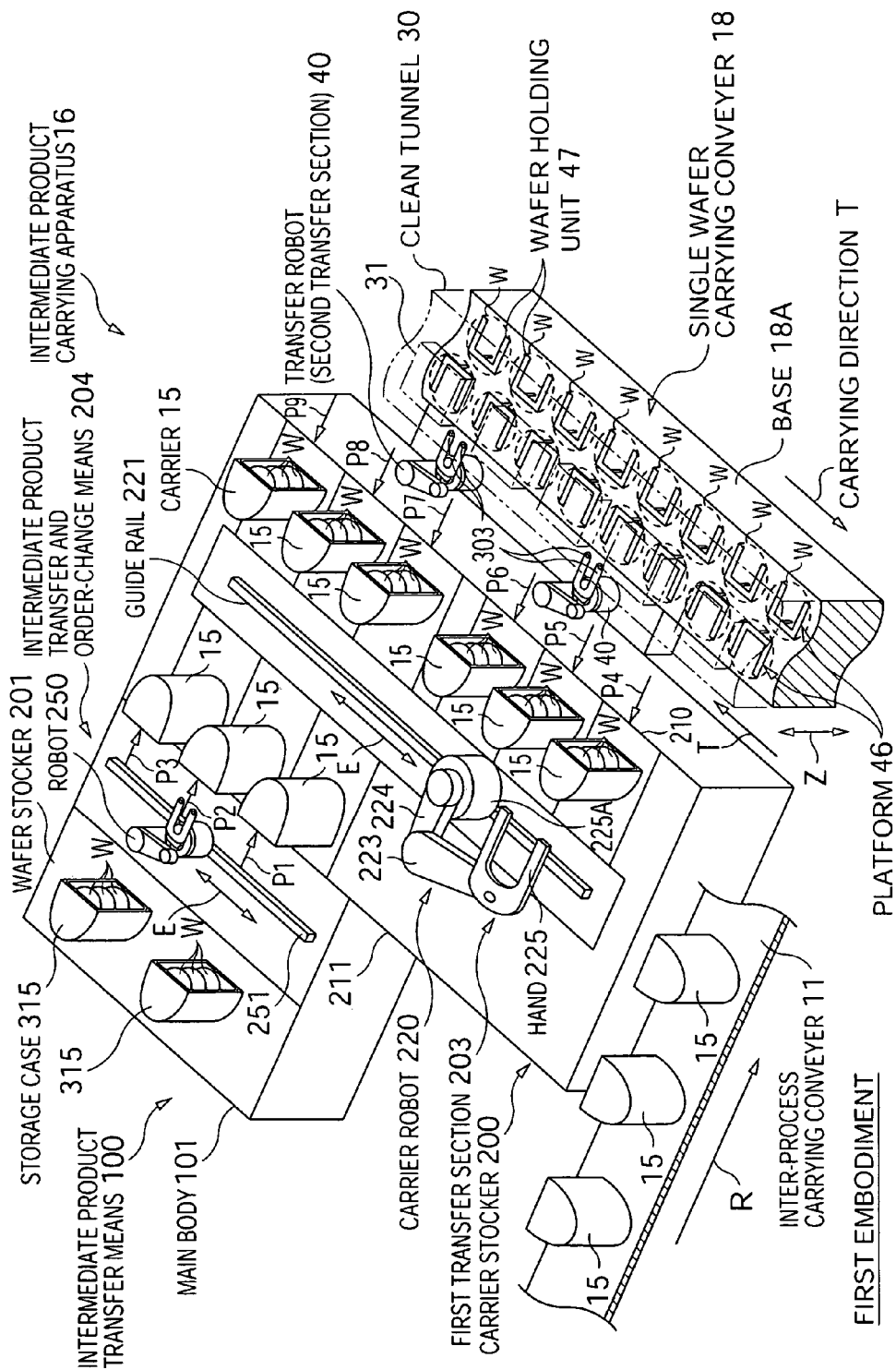
FIG. 3 is a perspective view showing an intermediate product transfer means, an inter-process carrying conveyer and a single wafer carrying conveyer of the process system shown in FIG. 2.

As shown in FIG. 3, the clean tunnel 30 has a plurality of fan-attached filter units (FFUs) 31. The fan-attached filter units 31 are provided on the ceiling of the clean tunnel 30. The fan-attached filter units 31 generate air-flow (down-flow) from the ceiling to below the bottom thereof, whereby dust in the air is removed to maintain the inside of the clean tunnel within a predetermined cleanliness level (cleanliness class).

The intermediate product carrying apparatus 16 of FIG. 1 is provided in each process system 13, 14 and 19. Each process system 13, 14 and 19 comprises, for example, the intermediate product carrying apparatus 16, and one or more manufacturing apparatuses 23 through 26. The manufacturing apparatuses 23 through 26 are a variety of wafer manufacturing apparatuses, such as lithography apparatuses, film forming apparatuses, etching apparatuses, cleaning apparatuses, inspection apparatuses, etc., which are arranged in a necessary order. The manufacturing apparatuses 23 through 26 may be also called processing apparatuses or production apparatuses.

As an example, process system 13 shown in FIG. 1 is an exposure process module, process system 14 is an etching/peeling process module, and process system 19 is a film forming process module.

In each module, it is preferable that a series of apparatuses required for the respective processes be arranged along the single wafer carrying conveyer 18 in the order of processes.

However, the kinds of the process modules 13, 14, 19 are not limited to those described herein, but are only examples.

First Embodiment

Figure 2:
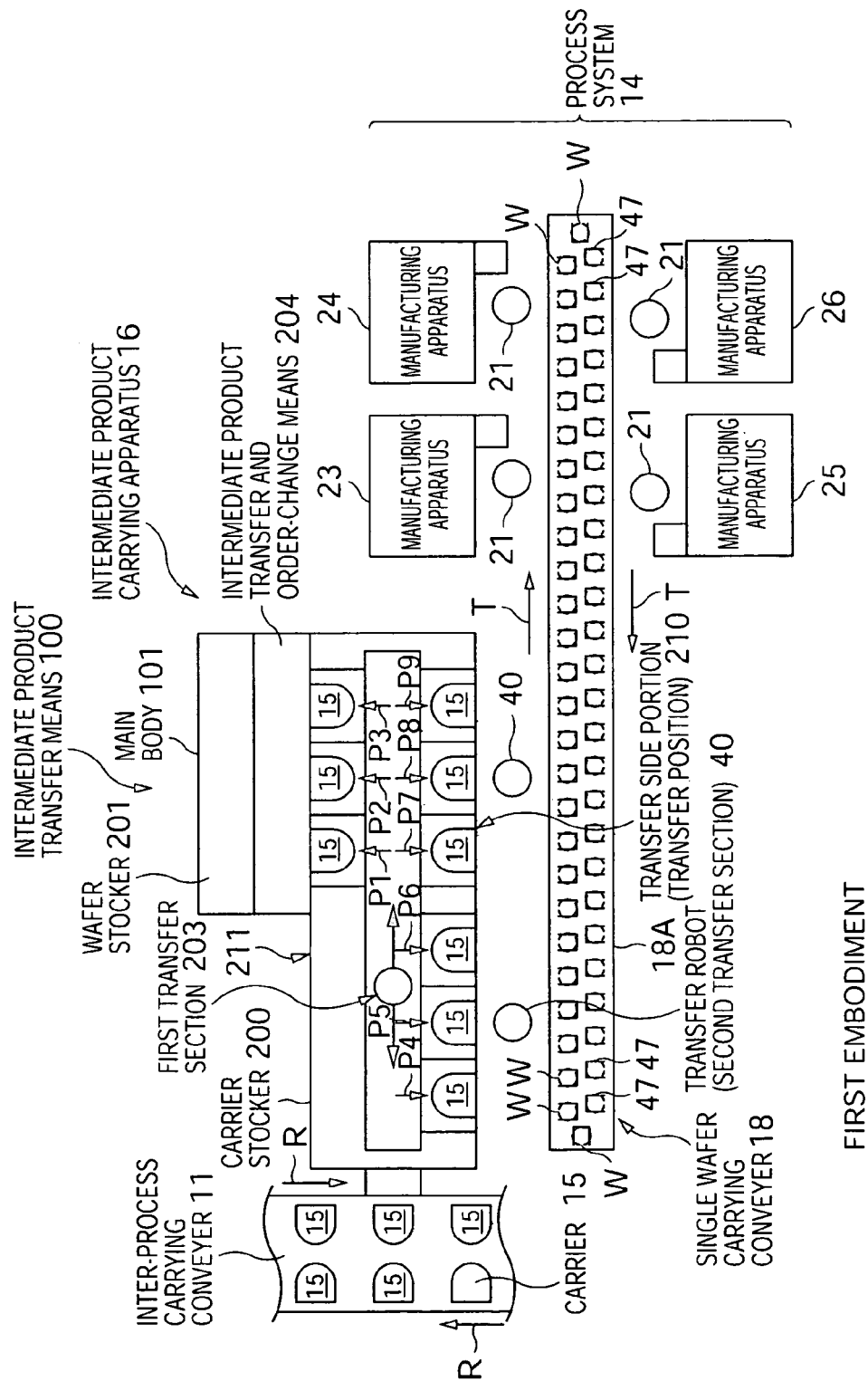
FIG. 2 is a plan view showing one process system of FIG. 1.

FIG. 2 shows an enlarged view of the intermediate product carrying apparatus 16 in the respective process systems 13, 14, 19 shown in FIG. 1. Since the intermediate product carrying apparatuses 16 have substantially the same structure in the respective process systems 13, 14, 19, the process system 14 and the intermediate product carrying apparatus 16 thereof will be representatively described with reference to FIG. 2.

In FIGS. 1 and 2, the carriers 15 carried by means of the inter-process carrying conveyer 11 are also called FOUPs or wafer cassettes, etc., and can seal the wafers.

The process system 14 shown in FIG. 2 is provided corresponding to the inter-process carrying conveyer 11. The process system 14 has one single wafer carrying conveyer 18, a plurality of manufacturing apparatuses 23, 24, 25, 26, and an intermediate product transfer means 100.

The carrying direction in which the single wafer carrying conveyer 18 carries the wafers is indicated by T. An intermediate product transfer means 100 is provided between the inter-process carrying conveyer 11 and the manufacturing apparatus 23. The manufacturing apparatuses 23, 24 are arranged in the carrying direction T along one side of the single wafer carrying conveyer 18. Similarly, the other two manufacturing apparatuses 25, 26 are arranged in the carrying direction T along the other side of the single wafer carrying conveyer 18.

FIG. 3 is a perspective view showing a specific example of some parts of the intermediate product carrying apparatus 16 and the inter-process carrying conveyer 11 shown in FIG. 2.

First, the single wafer carrying conveyer 18 shown in FIGS. 2 and 3 will be described.

The single wafer carrying conveyer 18 has a base 18A and a plurality of platforms 46. The single wafer carrying conveyer 18 is an apparatus for continuously carrying a plurality of wafers W in the carrying direction T. The respective platforms 46 can be continuously moved on the base 18A in the carrying direction T. The respective platforms 46 are arranged in the carrying direction T in equally spaced intervals.

Each platform 46 has at least one wafer holding unit 47. The wafer holding unit 47 is substantially U-shaped, and may detachably mount wafers W thereon. In the example shown in FIG. 3, the platform 46 has one wafer holding unit 47.

However, a plurality of wafer holding units 47 may be arranged in spaced relationship in the Z direction, that is, an upper direction, perpendicular to the carrying direction T.

As a result, since each platform 46 has a plurality of wafer holding units 47, each platform 46 can hold and carry at least one wafer W. Therefore, it is possible to enhance the carrying efficiency with which the single wafer carrying conveyer 18 carries the wafers W.

Figure 4:
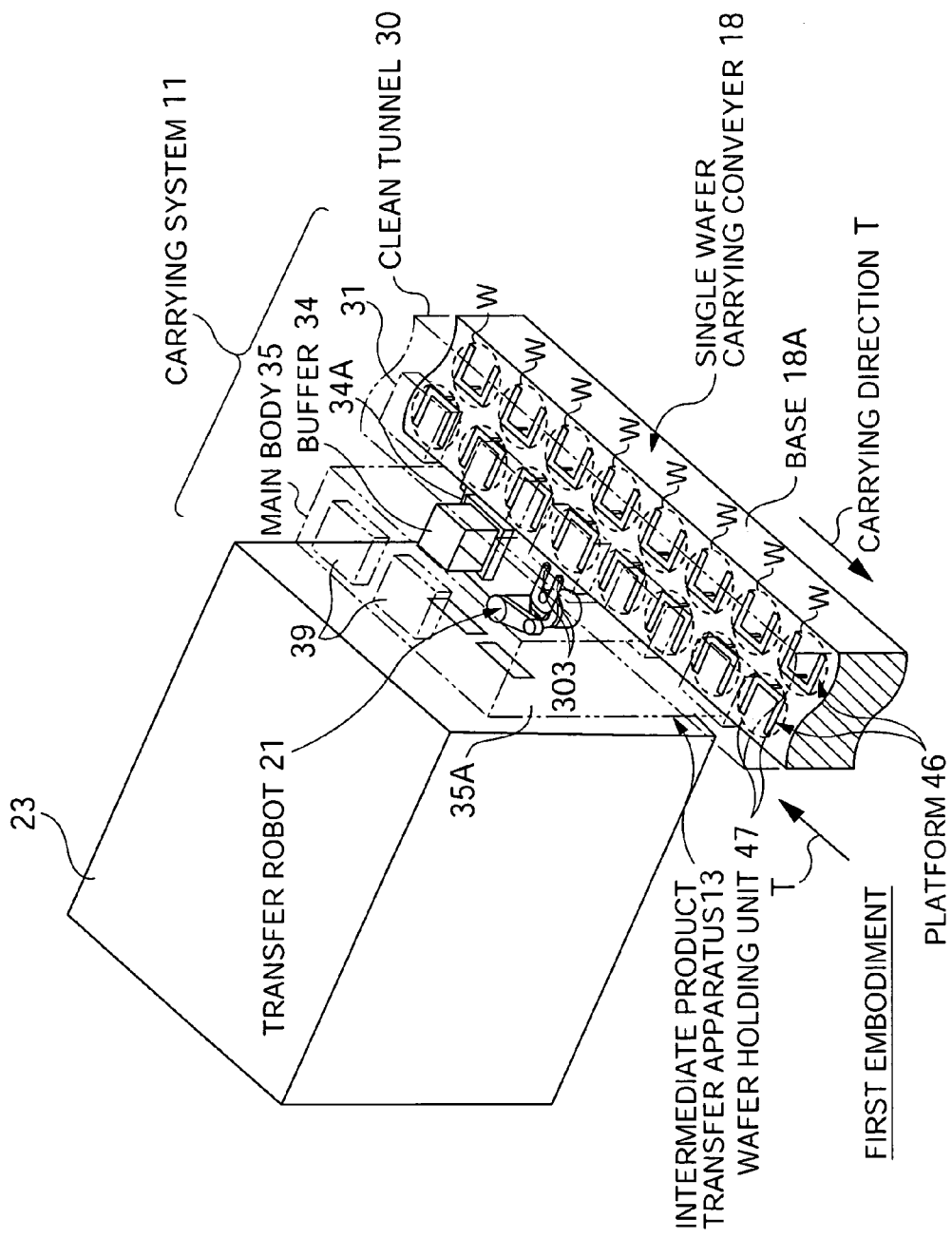
FIG. 4 is a perspective view showing one manufacturing apparatus and a part of a single wafer carrying conveyer which are a part of the process system shown in FIG. 2.

FIG. 4 shows more specifically and representatively a structure of some parts of one manufacturing apparatus 23 and the single wafer carrying conveyer 18 shown in FIG. 2.

A transfer robot 21 and a buffer 34 are provided between the manufacturing apparatus 23 and the single wafer carrying conveyer 18. The transfer robot 21 is an apparatus for transferring wafers W between the platforms 46 of the single wafer carrying conveyer 18 and the manufacturing apparatus 23.

The buffer 34 has the following function. When the transfer robot 21 catches a wafer W of the wafer holding unit 47 but cannot directly transfer the wafer into the manufacturing apparatus 23, the wafer W is temporarily stored in the buffer 34.

Similarly, when the transfer robot 21 catches a processed wafer W from the manufacturing apparatus 23 but cannot transfer directly the wafer into the wafer holding unit 47 of the single wafer carrying conveyer 18, the wafer W is temporarily stored in the buffer 34.

As a result, it is possible to smoothly and efficiently transfer wafers between the manufacturing apparatus 23 and the platforms 46.

A transfer robot 21 and a buffer 34 are provided between each manufacturing apparatus 23 through 26 and the single wafer carrying conveyer 18 shown in FIG. 2.

As shown in FIG. 4, the transfer robot 21 and the buffer 34 are partitioned by a main body 35. An upper portion of the main body 35 is provided with fan-attached filter units (FFU) 39. By operation of the fan-attached filter units 39, air-flow (down-flow) is generated in the main body 35, so that the inside of the main body 35 can be maintained with a predetermined cleanliness.

The platforms 46 of the single wafer carrying conveyer 18 shown in FIGS. 3 and 4 are covered with a clean tunnel 30. An upper portion of the clean tunnel 30 is provided with fan-attached filter units 31. By operation of the fan-attached filter units 31, air-flow (down-flow) is generated in a closed space within the clean tunnel 30, so that the inside of the clean tunnel 30 can be maintained with a predetermined cleanliness.

Next, the structure of the intermediate product transfer means 100 shown in FIGS. 2 and 3 will be described.

More specifically, the intermediate product carrying apparatus 16 of FIG. 2 comprises the intermediate product transfer means 100 and the single wafer carrying conveyer 18. The intermediate product transfer means 100 has a main body 101 and two transfer robots 40.

The transfer robots 40 will be described first.

The transfer robots 40 have the same structure as that of the transfer robot 21 shown in FIG. 4. The transfer robots 40 are apparatuses for transferring wafers W between carriers 15 of the intermediate product transfer means 100 side and the wafer holding units 47 of the platforms 46 of the single wafer carrying conveyer 18.

In the example of FIGS. 2 and 3, two transfer robots 40 are provided between the single wafer carrying conveyer 18 and the intermediate product transfer means 100.

Figure 5:
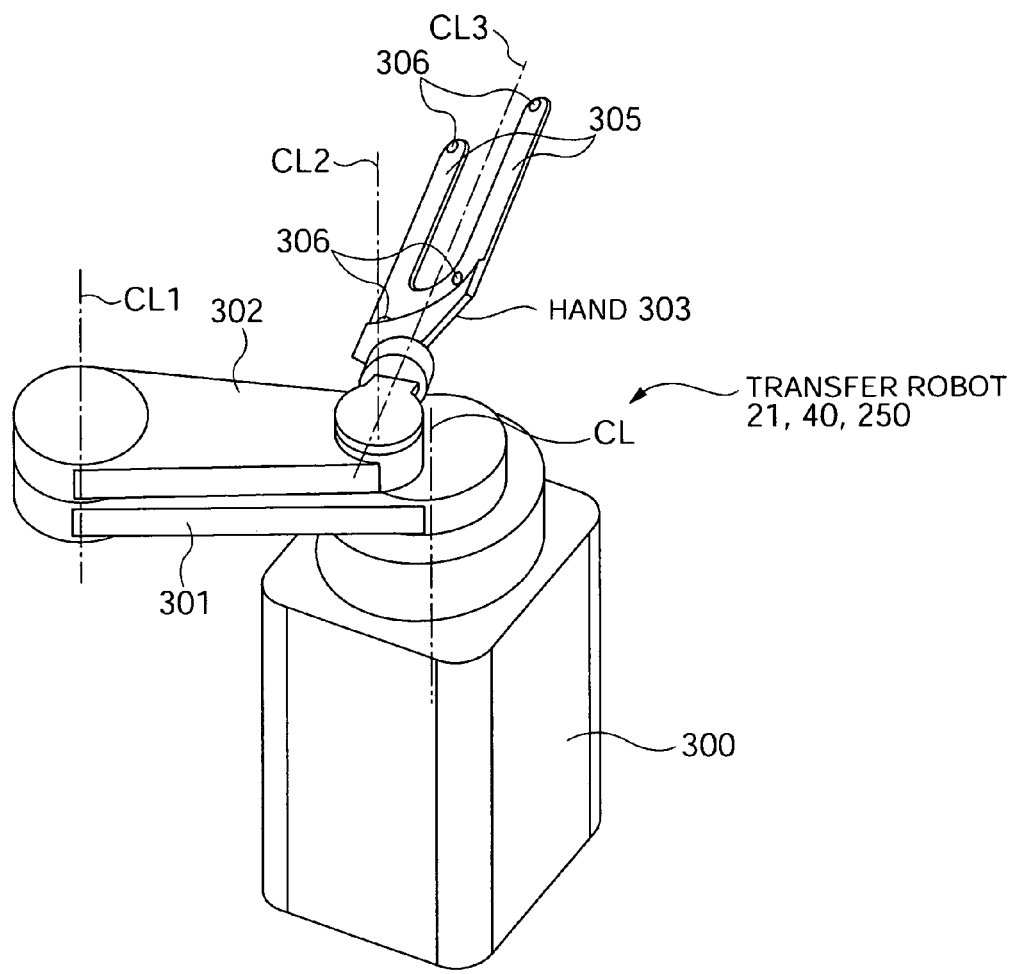
FIG. 5 is a perspective view showing a structural example of a transfer robot.
Figure 6:
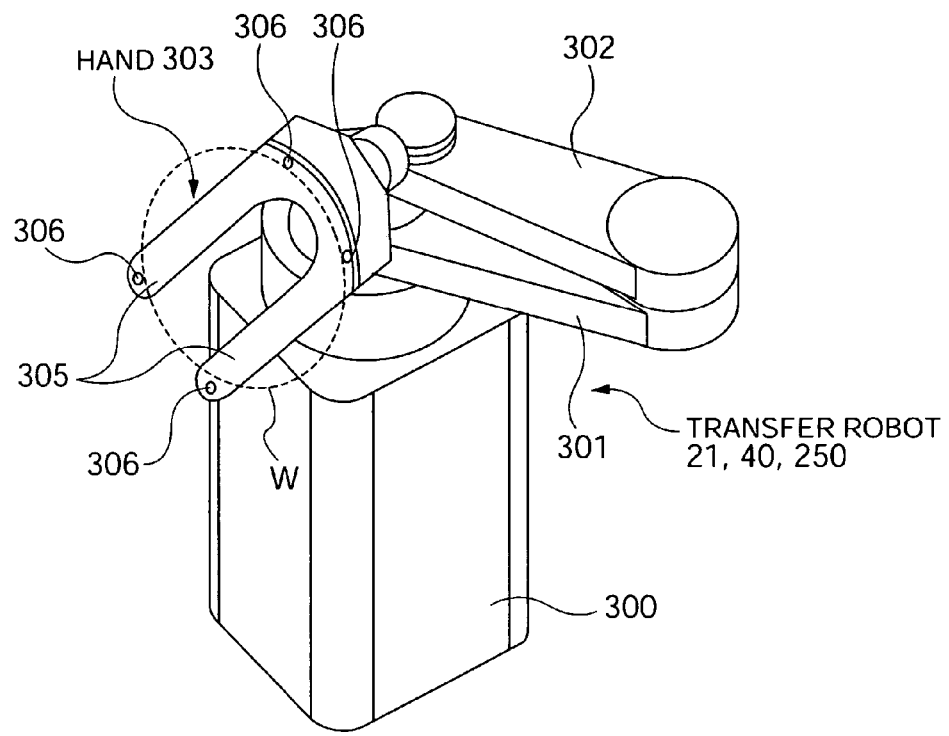
FIG. 6 is a perspective view of the transfer robot of FIG. 5 as seen from another angle.

The structures of the transfer robots 40 shown in FIG. 3 and the transfer robot 21 shown in FIG. 4 are specifically illustrated in FIGS. 5 and 6.

The respective transfer robots 21, 40 have a main body 300, a first arm 301, a second arm 302, and a hand 303. The first arm 301 is rotatable about a central axis CL of the main body 300. The second arm 302 is rotatable about a rotary axis CL1 of the first arm 301. The hand 303 is rotatable about a rotary axis CL2 and a rotary axis CL3.

The hand 303 has substantially U-shaped arm portions 305, 305. The arm portions 305, 305 have support portions 306 for holding the outer circumferential edge surface of a wafer W.

Figure 7:
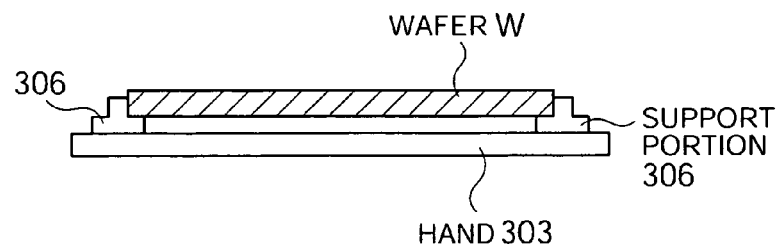
FIG. 7 is a diagram showing a state in which a wafer is held by a hand of the transfer robot.

FIG. 7 shows the hand 303 of the transfer robot 21 shown in FIGS. 5 and 6. The support portions 306 of the hand 303 support the outer circumferential edge portion of the wafer W.

Next, the main body 101 of the intermediate product transfer means 100 will be described with reference to FIGS. 2 and 3.

The intermediate product transfer means 100 has a carrier stocker 200, a wafer stocker (that corresponds to an intermediate product stocker) 201, a first transfer section 203, and an intermediate product transfer and order-change means 204. The intermediate product transfer means 100 has a main body 101 and transfer robots 40, and the transfer robots 40 are second transfer sections.

The carrier stocker 200 shown in FIGS. 2 and 3 can stock (store) a plurality of carriers 15. In the example of FIG. 2, the carrier stocker 200 has a rectangular shape as seen two-dimensionally. A longitudinal side of the carrier stocker 200 is parallel to the carrying direction T of the single wafer carrying conveyer 18. The carrier stocker 200 has a wafer transfer and order-change processing side portion 211 and a wafer transfer side portion (which may be referred to as a wafer transfer position) 210.

In the transfer side portion 210 of the carrier stocker 200, for example, a maximum of six carriers 15 can be arranged in spaced intervals, as seen in the example of FIG. 2. In the order-change processing side portion 211 of the carrier stocker 200, for example, a maximum of three carriers 15 can be arranged in spaced intervals. The carriers 15 are arranged in the carrier stocker 200 to be parallel to the carrying direction T.

As described above, the carrier stocker 200 can stock a plurality of carriers 15. The transfer side portion 210 of the carrier stocker 200 is, for example, perpendicular to the carrying direction R of the inter-process carrying conveyer 11.

The center of the carrier stocker 200 shown in FIGS. 2 and 3 is provided with the first transfer section 203.

The first transfer section 203 has a carrier robot 220 for transferring carriers 15 between the carrier stocker 200 and the inter-process carrying conveyer 11.

The first transfer section 203 has a guide rail 221, in addition to the carrier robot 220. The carrier robot 220 can be moved and positioned in the E direction along the guide rail 221.

As shown in FIG. 3, the structure of the carrier robot 220 is similar to that of the transfer robots 40. An arm 223 of the carrier robot 220 is rotatably supported about the arm 224. The arm 224 is rotatably supported about a main body 225. The front end of the arm 223 is provided with a hand 225. The hand 225 can detachably hold the carrier 15.

By moving the carrier robot 220 in the E direction, the carrier 15 on the inter-process carrying conveyer 11 can be delivered to any one of positions P1, P2, P3 of the carrier stocker 200. The carrier robot 220 can deliver the carriers 15 located at positions P1 through P3 of the carrier stocker 200 to any one of positions P4 through P9.

Also, the carrier 15 in which the wafers W processed by the manufacturing apparatuses 23 through 26 are housed can be discharged to the inter-process carrying conveyer 11 by using the carrier robot 220.

As described above, the carrier robot 220 has a function of performing the transfer between the inter-process carrying conveyer 11 and, for example, the positions P1 through P9 on the carrier stocker 200.

Positions P1 through P3 are arranged in series in the transfer and order-change processing side portion 211 of the carrier stocker 200. Positions P4 through P9 are arranged in series in the transfer side portion 210 of the carrier stocker 200.

Next, the intermediate product transfer and order-change means 204 shown in FIGS. 2 and 3 will be described.

The intermediate product transfer and order-change means 204 specifically shown in FIG. 3 is provided between the wafer stocker 201 and the carrier stocker 200. The intermediate product transfer and order-change means 204 has a robot 250 of the same structure as, for example, that of the transfer robots 40, and a guide rail 251. The robot 250 can be moved and positioned in the E direction.

A hand 303 of the robot 250 shown in FIG. 3 can transfer wafers W between the carriers 15 at positions P1 through P3 of the carrier stocker 200 and the storage cases 315 of the wafer stocker 201. By transferring and exchanging wafers W, the robot 250 can change the arrangement order (which may be referred to as rearranging) of the wafers W in the carriers 15 located at positions P1 through P3.

The wafer stocker 201 shown in FIG. 3 has storage cases 315. The storage cases 315 may have the same structure as, for example, that of the carriers 15. Doorways of the storage cases 315 face doorways of the carriers 15 located at positions P1 through P3. Doorways of the carriers 15 located at positions P4 through P9 face the single wafer carrying conveyer 18.

Next, referring to FIG. 8, an example of an intermediate product carrying method according to the present invention using the intermediate product carrying apparatus 16 will be described.

Figure 8:
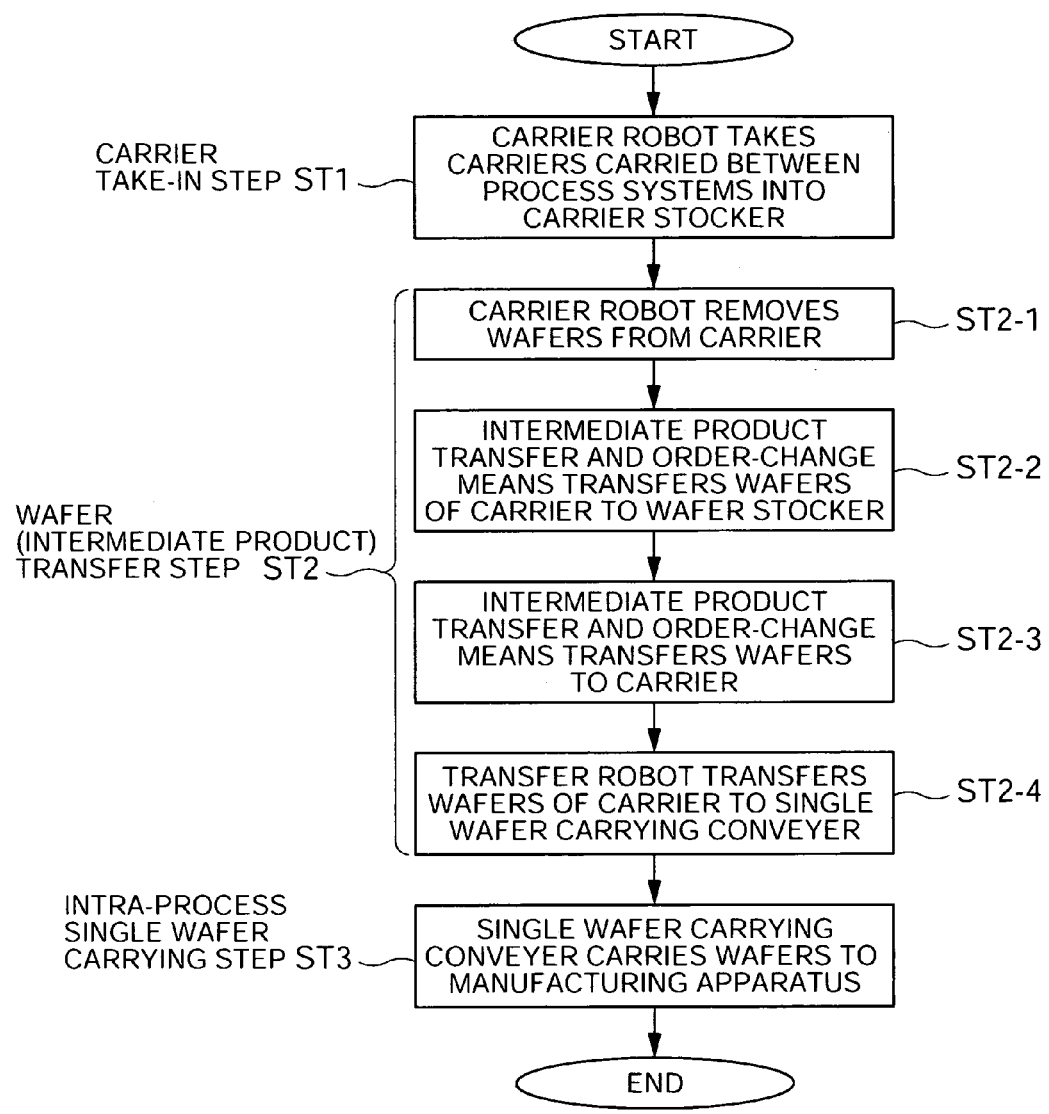
FIG. 8 is a flowchart showing an example of an intermediate product carrying method according to the present invention.

In FIG. 8, the carrier take-in step ST1, the wafer (an intermediate product) transfer step ST2, and the intra-process single wafer carrying step ST3 are shown approximately.

The wafer transfer step ST2 includes step ST2-1 through step ST2-4.

First, the carrier take-in step ST1 shown in FIG. 8 will be described.

At the carrier take-in step ST1, the inter-process carrying conveyer 11 shown in FIG. 2 carries a carrier 15 from the previous process system, that is, the process system 13 shown in FIG. 1 to the process system 14 shown in FIGS. 2 and 3.

The carried carrier 15 is taken into the carrier stocker 200 by operation of the carrier robot 220 of the first transfer section 203 shown in FIG. 3.

The taken-in carrier 15 is put at one of the empty positions P1 through P3 of the carrier stocker 200 by operation of the carrier robot 220.

Next, step ST2-1 of the wafer transfer step ST2 shown in FIG. 8 is performed.

At step ST2-1, the robot 250 of the transfer and order-change means 204 shown in FIG. 3 removes the wafers W from the taken-in carrier 15 at, for example, position P1.

Next, step ST2-2 is performed, so that the robot 250 transfers the wafers W removed from the carrier 15 at position P1 to a place of a predetermined number of stages in the storage case 315. That is, the robot 250 transfers the wafers W from the carrier 15 at position P1 to a predetermined number of stages of the storage case 315 of the wafer stocker 201.

By repeating steps ST2-1 and ST2-2, the wafers W from the taken-in carriers 15 at positions P1 through P3 are stored in the storage cases 315 of the wafer stocker 201.

Next, as shown at step ST2-3 of FIG. 8, the robot 250 shown in FIG. 3, that is, the robot 250 of the intermediate product transfer and order-change means 204, stores the wafers W from the storage cases 315 into an empty carrier 15 at positions P1 through P3, for example, an empty carrier 15 at position P3, in a predetermined order.

Considering that the wafers W are transferred in an arbitrary order from the carrier stocker 200 to the wafer holding units 47 of the single wafer carrying conveyer 18 by the transfer robots 40, the wafers W are stored in the carrier 15 at the position P3.

Next, at step ST2-4, the carrier robot 220 shown in FIG. 3 moves the carrier 15 at position P3, for example, to the empty position P6. Then, the transfer robots 40 sequentially transfer the wafers W stored in the carrier 15 located at position P6 to the wafer holding units 47 of the platforms 46 in the single wafer carrying conveyer 18.

Next, the intra-process single wafer carrying step ST3 of FIG. 8 is preformed.

At step ST3, the platforms 46 of the single wafer carrying conveyer 18 shown in FIG. 2 are carried in the carrying direction T. By carrying the platforms 46 in the carrying direction T, the wafers W transferred in consideration of the transfer order reach the manufacturing apparatus 23 shown in FIG. 4.

The transfer robot 21 shown in FIG. 4 transfers the wafers W on the wafer holding units 47 of the platforms 46 to the manufacturing apparatus 23. At this time, when the wafers W cannot be directly transferred to the manufacturing apparatus 23, the wafers W are temporarily stored in the buffer 34.

After processing the wafers W in the manufacturing apparatus 23, the wafers W are transferred to the empty wafer holding units 47 of the platforms 46. At this time, when the wafers W cannot be directly transferred to the wafer holding units 47, the processed wafers W are temporarily stored in the buffer 34.

As described above, the intermediate product transfer means 100 shown in FIGS. 2 and 3 determines the transfer order in which the wafers W to be processed are transferred to the single wafer carrying conveyer 18 in consideration of the operational state of the manufacturing apparatuses 23 through 26 connected to the single wafer carrying conveyer 18, and then transfers the wafers.

When the manufacturing apparatuses 23 through 26 shown in FIG. 2 cannot take in the wafers W directly, the carriers 15 remain at positions P4 through P9, so that the transfer robots 40 of FIG. 2 are not allowed to directly transfer the wafers W from the carriers 15 to the wafer holding units 47. As a specific example, a case where one of the manufacturing apparatuses 23 through 26 is out of order or cannot be operated due to maintenance thereof can be considered.

For example, in a case where the manufacturing apparatus 23 needs to process a plurality of wafers W in the same procedure, the plurality of wafers W of the same procedure are stored in one of the carriers 15 at positions P4 through P9 in a bundle.

For example, in a case where the manufacturing apparatus 23 processes the wafers in a different procedure, until the procedure is started, the wafers W are kept stored in the carriers 15 located at positions P1 through P3 or positions P4 through P9.

When the wafers W can be transferred to the wafer holding units 47 of the single wafer carrying conveyer 18 of FIG. 3, it is preferable that the carriers 15 be transferred from positions P1 through P3 to positions P4 through P9.

Positions P1 through P3 are so-called wait positions of the carriers 15, and positions P4 through P9 are transfer positions from which the wafers W of the carriers 15 are transferred to the wafer holding units 47.

Second Embodiment

Figure 9:
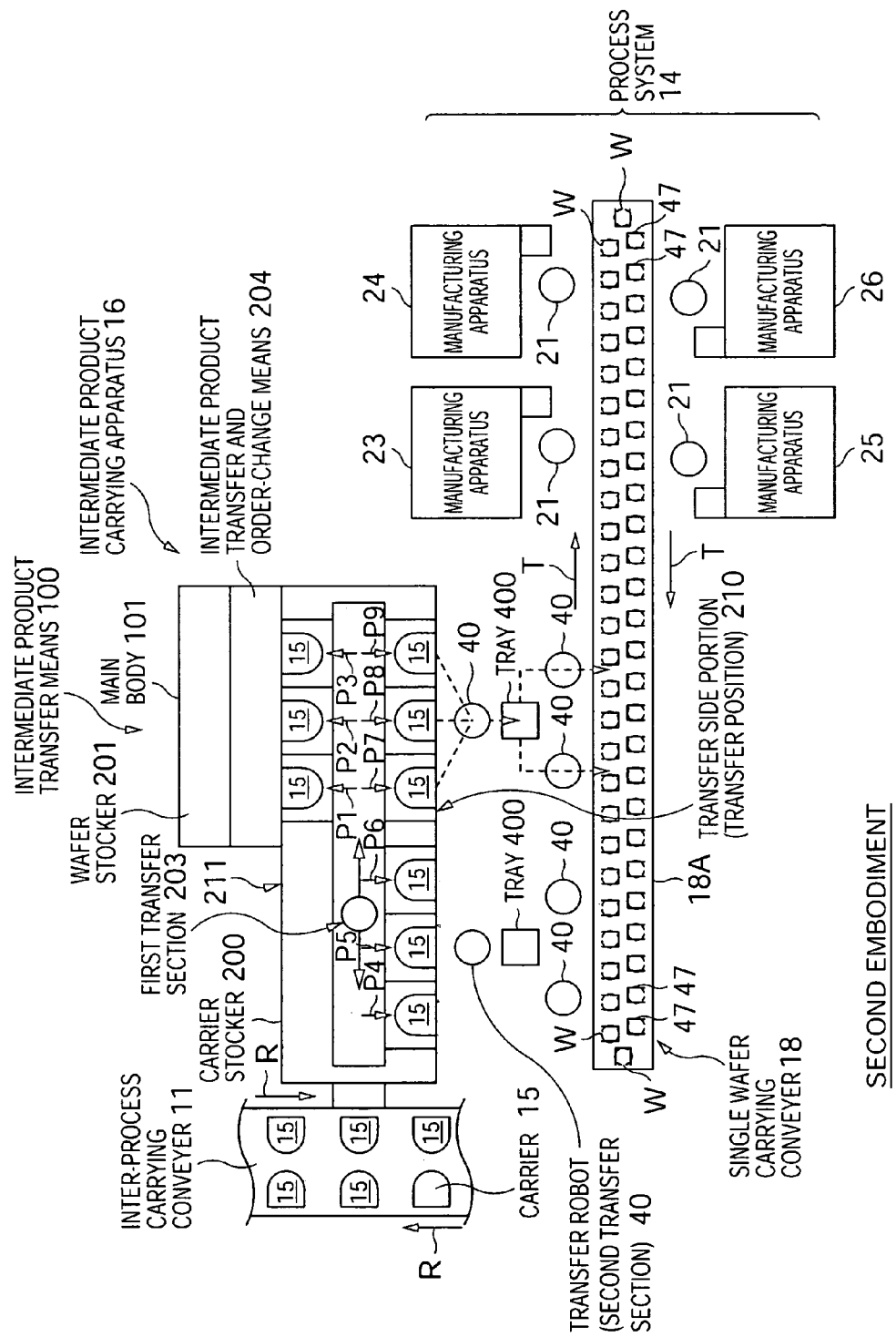
FIG. 9 is a plan view showing another embodiment of the present invention.

FIG. 9 shows a second embodiment of the intermediate product carrying apparatus according to the present invention.

The second embodiment shown in FIG. 9 is different from the first embodiment shown in FIGS. 2 and 3 in that all six transfer robots 40, as the second transfer section, are provided between the single wafer carrying conveyer 18 and the intermediate product transfer means 100.

With respect to the transfer robots 40, three transfer robots 40 are arranged between position P5 and the single wafer carrying conveyer. Similarly, three transfer robots 40 are also arranged, for example, between position P8 and the single wafer carrying conveyer 18. A group including the three transfer robots 40 is provided with one tray 400. The tray 400 is located between one transfer robot 40 of the transfer side portion 210 side and two transfer robots 40 of the single wafer carrying conveyer 18 side. By providing at least three transfer robots 40 and the tray 400, the following advantages can be obtained.

When the wafers W are transferred from any carrier 15 located at positions P4 through P9 to the single wafer carrying conveyer 18 side, two transfer robots are provided at the single wafer carrying conveyer 18 side.

For this reason, the time required for transferring wafers W to the single wafer carrying conveyer 18 can be shortened compared with the first embodiment shown in FIG. 2. That is, the transfer robots 40 of the transfer side portion 210 load wafers W on the tray 400, and then the plurality of wafers W loaded on the tray 400 can be transferred to the single wafer carrying conveyer 18 side for a short time by using the two transfer robots 40.

As a result, in the aforementioned embodiments of the present invention, the intermediate product transfer means 100 shown in FIGS. 2 and 3 or in FIG. 9 takes in and stocks carriers 15 carried by means of the inter-process carrying conveyer 11. Then, the intermediate product transfer means 100 stocks the wafers W in the carrier stocker into the wafer stocker 201.

The wafers W of the wafer stocker 201 are transferred again to an empty carrier 15 in consideration of order by using the intermediate product transfer and order-change means 204. In this case, the arrangement order of the wafers W in the carrier 15 is determined in accordance with the order in which the wafers W are transferred to the single wafer carrying conveyer 18, for example, in consideration of the operational state of the manufacturing apparatuses 23 through 26.

The carriers 15 are stocked at positions P1 through P3, but when it is time to transfer the wafers, it is preferable that the carriers 15 be moved to empty places of positions P4 through P9. Accordingly, when it is time to transfer wafers W to the wafer holding units 47 of the platforms 46, the transfer robots 40 can transfer the wafers W in any carrier of those at positions P4 through P9 to the single wafer carrying conveyer 18 in the transfer order considering the operational state of the manufacturing apparatuses 23 through 26.

A plurality of wafers W having the same destination are stored in the carriers 15 located at positions P4 through P9. Wafers W having the same destination are, for example, wafers to be processed in the manufacturing apparatus 23. Similarly, wafers having the same destination are also carried to and processed by the manufacturing apparatuses 24 through 26.

The transfer side portion 210 of the carrier stocker 200 shown in FIGS. 2 and 3 corresponds to the transfer position of the wafers W. In contrast, the transfer and order-change processing side portion 211 of the carrier stocker 200 is a position where the wafers are rearranged in accordance with the transfer order determined by considering the operational state of the manufacturing apparatuses, that is, the arrangement processing order of the wafers W.

The present invention is not limited to the aforementioned embodiments, but various modifications may be made thereto without departing from the appended claims.

In the respective constructions of the aforementioned embodiments, some elements may be omitted or combined arbitrarily, unlike the constructions described above.

In the embodiments according to the present invention, semiconductor wafers W are used as an example of the intermediate products. However, the intermediate products are not limited to semiconductor wafers, but may be others including substrates used for liquid crystal display devices or wafers for the substrates.

The present invention is not limited to the aforementioned embodiments, but various modifications may be made thereto without departing from the scope of the appended claims.

What is claimed is:

1. An intermediate product carrying apparatus for taking a carrier, which is carried between a plurality of process systems and which stores a plurality of intermediate products, into a desired process system, and then transferring the plurality of intermediate products in the carrier to a single wafer carrying conveyer, which carries the intermediate products in a single wafer state to an intermediate product manufacturing apparatus provided in the desired process system, the intermediate product carrying apparatus comprising:

an intermediate product transfer means provided in the desired process system, for taking the carrier into the desired process system and transferring the intermediate products between the carrier and another carrier, the intermediate product transfer means comprising:

a carrier stocker having a first plurality of carrier positions on an order-change processing side of the carrier stocker and a second plurality of carrier positions on a transfer side of the carrier stocker, the transfer side of the carrier stocker being adjacent to the single-wafer carrying conveyor;

a carrier robot for transferring the carrier between an inter-process carrying conveyor and at least one carrier position selected from the first and second plurality of carrier positions on the carrier stocker; and a change order robot adjacent to the order-change processing side of the carrier stocker for transferring the intermediate products stored in at least one carrier located in the first plurality of carrier positions on the order-change processing side of the carrier stocker to a plurality of storage cases, for changing an arrangement order of the intermediate products, and for transferring the intermediate products from the storage cases to the at least one carrier located in first plurality of carrier positions on the order-change processing side of the carrier stocker.

2. The intermediate product carrying apparatus according to claim 1, wherein the single wafer carrying conveyor has a plurality of platforms in the carrying direction, and each platform holds at least one intermediate product.

3. The intermediate product carrying apparatus according to claim 1 further comprising:

a transfer section comprising a transfer robot for transferring the order-changed intermediate products between at least one carrier located in the plurality of carrier positions on the transfer side of the carrier stocker and the single wafer carrying conveyor.

4. The intermediate product carrying apparatus according to claim 3, wherein the transfer section comprises a plurality of transfer robots, and wherein a tray for the intermediate products is provided between each transfer robot of the plurality of transfer robots.

5. The intermediate product carrying apparatus according to claim 4, wherein the intermediate products are semiconductor wafers, and a plurality of manufacturing apparatuses for processing the intermediate products are arranged along the single wafer carrying conveyor.

6. An intermediate product carrying method of taking a carrier, which is carried between a plurality of process systems and which stores a plurality of intermediate products, into a desired process system, and then transferring and carrying the intermediate products of the carrier to another carrier, the method comprising:

a carrier take-in step of taking the carrier, which is carried between process systems and which stores the plurality of intermediate products, into the desired process system;

an intermediate product transfer step of transferring the intermediate products stored in the carrier and changing an order of the intermediate products in the carrier, and transferring the transferred intermediate products to a single wafer carrying conveyer; and an intra-process single wafer carrying step of carrying the intermediate products in a single wafer state to an intermediate product manufacturing apparatus provided in the process system by the single wafer carrying conveyer;

wherein the changing the order of the intermediate products in the carriers comprises:

transferring the intermediate products in the carrier to at least one storage case; and transferring the intermediate products from the at least one storage case to the carrier in a changed order.

7. The intermediate product carrying method according to claim 6, wherein the intermediate products comprises semiconductor wafers, the single wafer carrying conveyer has a plurality of platforms in the carrying direction, and each platform holds at least one intermediate product.

8. In a system including:

a plurality of process systems each including at least one product manufacturing apparatus and a single product carrying conveyer which carries products in a single product state relative to the at least one product manufacturing apparatus; and a carrier conveyer which conveys carriers between the process systems, each carrier storing a plurality of products;

the improvement comprising:

an intermediate product carrying apparatus disposed in at least one of the process systems, the intermediate product carrying apparatus taking carriers from the carrier conveyer and delivering the products from the carrier to the single product carrying conveyor;

wherein the intermediate product carrying apparatus comprises:

a carrier stocker having a first plurality of carrier positions on an order-change processing side of the carrier stocker and a second plurality of carrier positions on a transfer side of the carrier stocker, the transfer side of the carrier stocker being adjacent to the single product carrying conveyor:

a carrier robot for transferring the carrier between the carrier conveyer and at least one carrier position of the first and second plurality of carrier positions on the carrier stocker; and a change order robot adjacent to the order-change processing side of the carrier stocker for transferring intermediate products stored in at least one carrier located in the first plurality of carrier positions on the order-change processing side of the carrier stocker to a plurality of storage cases, for changing an arrangement order of the intermediate products, and for transferring the intermediate products from the storage cases to the at least one carrier located in first plurality of carrier positions on the order-change processing side of the carrier stocker.

* * * * *